United States Patent
Motoyama et al.

(10) Patent No.: US 12,131,947 B2
(45) Date of Patent: Oct. 29, 2024

(54) METHOD FOR MANUFACTURING SEMICONDUCTOR DEVICE AND SUBSTRATE PROCESSING APPARATUS

(71) Applicant: Tokyo Electron Limited, Tokyo (JP)

(72) Inventors: Yutaka Motoyama, Yamanashi (JP); Satoshi Takagi, Yamanashi (JP); Akari Matsunaga, Yamanashi (JP); Keisuke Fujita, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 39 days.

(21) Appl. No.: 17/648,700

(22) Filed: Jan. 24, 2022

(65) Prior Publication Data
US 2022/0238374 A1    Jul. 28, 2022

(30) Foreign Application Priority Data
Jan. 26, 2021  (JP) .................. 2021-010066

(51) Int. Cl.
| | |
|---|---|
| H01L 21/02 | (2006.01) |
| C23C 16/04 | (2006.01) |
| C23C 16/24 | (2006.01) |
| H01L 21/768 | (2006.01) |

(52) U.S. Cl.
CPC ...... *H01L 21/76879* (2013.01); *C23C 16/045* (2013.01); *C23C 16/24* (2013.01); *H01L 21/02123* (2013.01)

(58) Field of Classification Search
None
See application file for complete search history.

(56) References Cited

U.S. PATENT DOCUMENTS

| | | | |
|---|---|---|---|
| 2008/0090389 A1* | 4/2008 | Wang | C23C 16/0227 257/E21.101 |
| 2009/0253265 A1* | 10/2009 | Inokuchi | C23C 16/24 438/694 |
| 2017/0287778 A1* | 10/2017 | Okada | C23C 16/0272 |
| 2017/0365465 A1* | 12/2017 | Okada | H01L 21/02488 |
| 2018/0068889 A1* | 3/2018 | Choi | H01L 21/76879 |

FOREIGN PATENT DOCUMENTS

| | | |
|---|---|---|
| JP | 2017-228580 | 12/2017 |
| JP | 2018-022743 | 2/2018 |
| JP | 2019-024080 | 2/2019 |

* cited by examiner

*Primary Examiner* — Shamim Ahmed
*Assistant Examiner* — Bradford M Gates
(74) *Attorney, Agent, or Firm* — IPUSA, PLLC

(57) ABSTRACT

A method for manufacturing a semiconductor device is provided. In the method, a silicon-containing gas is supplied to a substrate having a recess in a surface thereof at a predetermined film deposition temperature, thereby depositing a first silicon film in the recess. Chlorine and hydrogen are supplied to the substrate while maintaining the predetermined film deposition temperature, thereby etching the first silicon film deposited in the recess to expand an opening width of the first silicon film. The silicon-containing gas is supplied to the substrate while maintaining the predetermined film deposition temperature, thereby further depositing a second silicon film on the first silicon film in the recess.

8 Claims, 10 Drawing Sheets

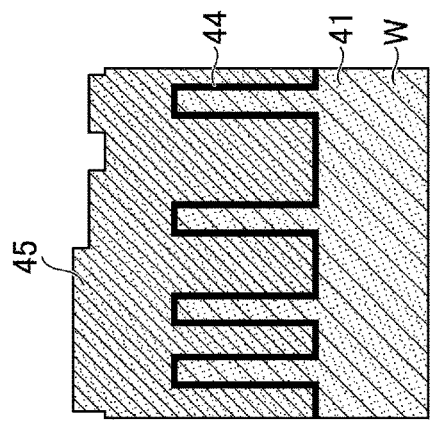
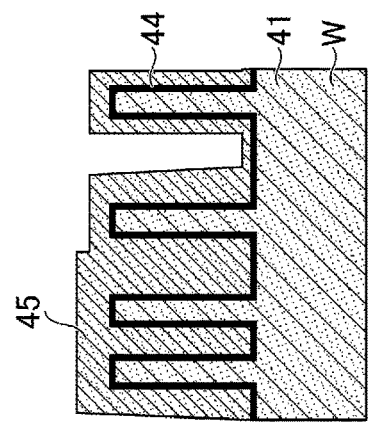
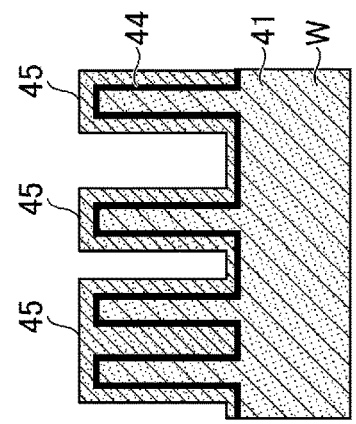
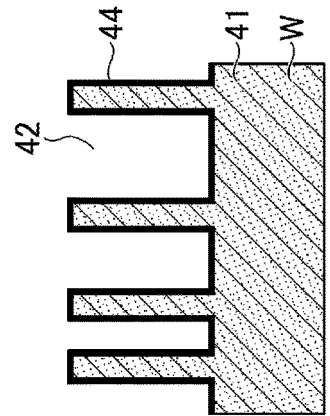

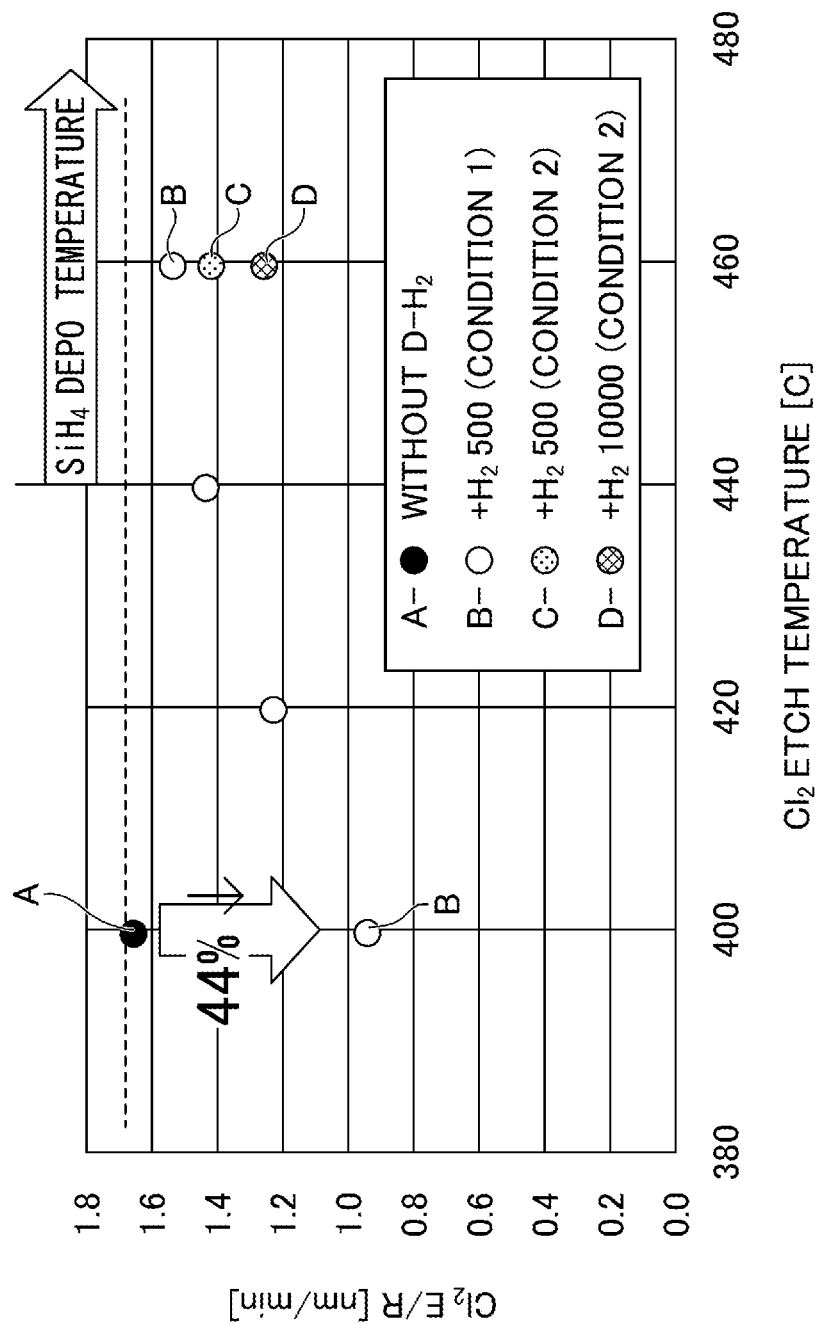

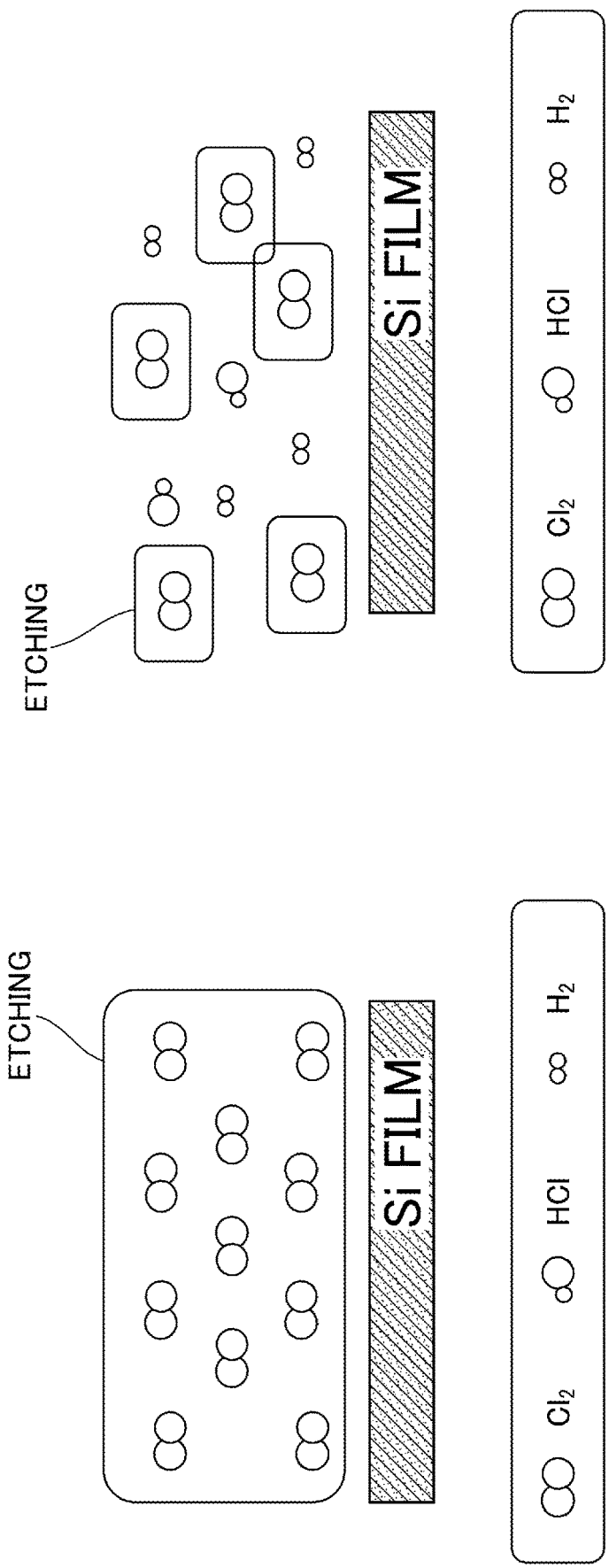

METHOD FOR MANUFACTURING SEMICONDUCTOR DEVICE AND SUBSTRATE PROCESSING APPARATUS

CROSS-REFERENCE TO RELATED APPLICATION

The present application is based on and claims priority to Japanese Priority Application No. 2021-010066 filed on Jan. 26, 2021, the entire contents of which are hereby incorporated herein by reference.

BACKGROUND OF THE INVENTION

1. Field of the Invention

The present disclosure relates to a method for manufacturing a semiconductor device and to a substrate processing apparatus.

2. Description of the Related Art

Japanese Laid-Open Patent Application Publication No. 2017-228580 discloses a method for manufacturing a semiconductor device by repeating a step of filling a recess with a silicon film by supplying a film deposition gas containing silicon to an object to be processed having the recess in a surface, and a step of broadening an opening width of the recess by supplying a halogen gas to etch the silicon film and a process gas containing a roughness inhibiting gas to inhibit the roughness of the surface of the silicon film after the etching by the halogen gas to the object to be processed and by activating the process gas while supplying thermal energy to the process gas to etch the silicon film. Such a filling method is referred to as a DED (Deposition Etch Deposition) process because of repeated film deposition and etching.

SUMMARY OF THE INVENTION

The present disclosure provides a method for manufacturing a semiconductor device and a substrate processing apparatus that can perform etching while maintaining a film deposition temperature, when filing a recess with a silicon film by repeating a film deposition process and an etching process.

According to one embodiment of the present disclosure, there is provided a method for manufacturing a semiconductor device. In the method, a silicon-containing gas is supplied to a substrate having a recess in a surface thereof at a predetermined film deposition temperature, thereby depositing a first silicon film in the recess. Chlorine and hydrogen are supplied to the substrate while maintaining the predetermined film deposition temperature, thereby etching the first silicon film deposited in the recess to expand an opening width of the first silicon film. The silicon-containing gas is supplied to the substrate while maintaining the predetermined film deposition temperature, thereby further depositing a second silicon film on the first silicon film in the recess.

BRIEF DESCRIPTION OF THE DRAWINGS

FIGS. 4A to 4D are diagrams illustrating a problem with filling a pattern in a typical DED process;

FIG. 7 is a diagram illustrating a specific method for manufacturing a semiconductor device according to the present embodiment;

FIGS. 8A and 8B are diagrams for explaining a reason why an etching rate is decreased by adding hydrogen to chlorine;

DETAILED DESCRIPTION OF THE PREFERRED EMBODIMENTS

Hereinafter, embodiments for carrying out the present invention will be described with reference to the drawings.

Figure 1:
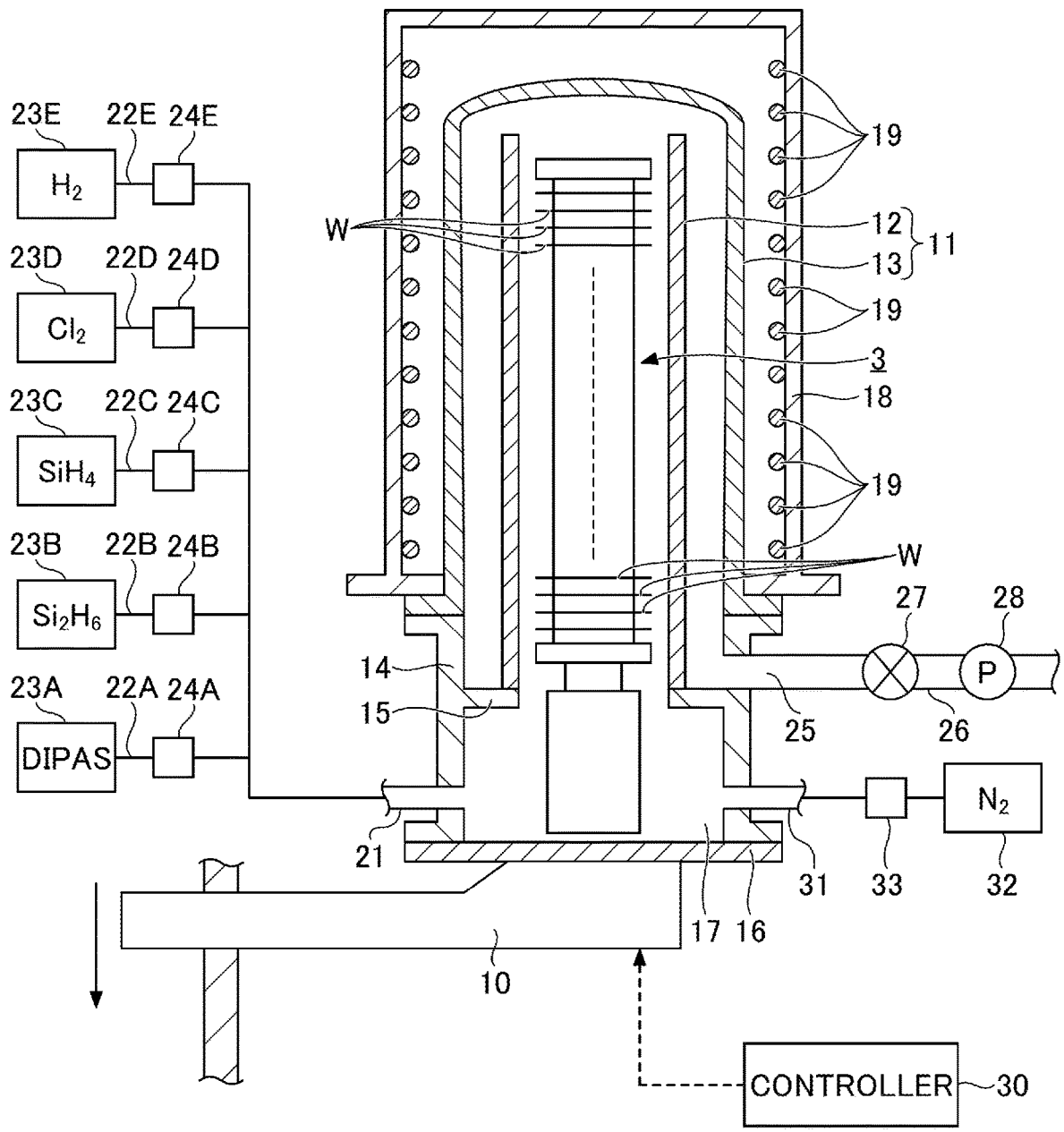
FIG. 1 is a diagram illustrating a substrate processing apparatus according to an embodiment of the present disclosure.

FIG. 1 is a diagram illustrating a substrate processing apparatus according to an embodiment of the present disclosure. In the present embodiment, an example in which the substrate processing apparatus is formed as a vertical heat processing apparatus will be described. The substrate processing apparatus according to the present disclosure is not limited to the vertical heat processing apparatus, but may be applied to a variety of substrate processing apparatuses that can alternately perform film deposition and etching. Applicable substrate processing apparatuses also include a single-wafer type substrate processing apparatus and a semi-batch type substrate processing apparatus. In the present embodiment, an example in which the substrate processing apparatus is formed as a vertical heat processing apparatus will be described.

The vertical heat processing apparatus performs a DED process to form a logic device of a semiconductor device into a wafer W, which is a substrate. That is, a film deposition process and an etching process are performed on the wafer W. This film deposition process is performed by a thermal CVD (Chemical Vapor Deposition), and the etching process is performed by a reactive gas etching in which thermal energy is supplied to the etching gas.

The logical device to be manufactured includes, in addition to the logical device manufactured according to the conventional art, a logical device using, for example, a FinFET that is the next generation transistor of a MOSFET (Metal Oxide Semiconductor Field Effect Transistor).

The vertical heat processing apparatus includes a reactor tube 11 that is a generally cylindrical vacuum chamber whose longitudinal direction extends in the vertical direction. The reactor tube 11 has a dual tube structure including an inner tube 12 and an outer tube 13 that is formed such that the outer tube 13 covers the inner tube 12 and has a constant distance from the inner tube 12. The outer tube 13 has a ceiling. The inner tube 12 and the outer tube 13 are formed of a heat resistant material such as quartz. The reactor tube 11 may be referred to as a process chamber because the reactor tube 11 forms a closed space for processing substrates.

A manifold 14 made of stainless steel (SUS) formed in a cylindrical shape is disposed below the outer tube 13. The manifold 14 is hermetically connected to the lower end of the outer tube 13. The inner tube 12 is supported by a support ring 15 that protrudes from the inner wall of the manifold 14 and is integrally formed with the manifold 14.

A lid 16 is disposed below the manifold 14, and a boat elevator 10 allows the lid 16 to be raised and lowered between the elevated and lowered positions. FIG. 1 illustrates that the lid 16 is positioned in an elevated position in which the lid 16 closes an opening 17 of the reactor tube 11 below the manifold 14 to seal the inside of the reactor tube 11. The lid 16 includes a wafer boat 3 made with, for example, quartz. The wafer boat 3 is configured to horizontally hold many wafers W, i.e. wafers to be processed as substrates, at a predetermined vertical distance. Around the reactor tube 11, an insulator 18 is disposed to surround the reactor tube 11, and an internal wall thereof includes a heater 19 made with a resistance heating element, which is, for example, a heating portion, so that the inside of the reactor tube 11 can be heated.

At the manifold 14, below the support ring 15 described above, a process gas inlet tube 21 and a purge gas inlet tube 31 are inserted, and the downstream end of each of the gas inlet tubes 21, 31 is arranged so as to supply gas to a wafer W within the inner tube 12. For example, the upstream side of the process gas inlet tube 21 branches out to form branches 22A to 22E, and upstream ends of the branches 22A to 22E are connected to a supply source 23A of diisopropylaminosilane (DIPAS) gas, a supply source 23B of disilane ($Si_2H_6$) gas, a supply source 23C of monoaminosilane ($SiH_4$) gas, a supply source 23D of chlorine ($Cl_2$) gas, and a supply source 23E of hydrogen ($H_2$) gas, respectively. The branches 22A to 22E include gas supply mechanisms 24A to 24E, respectively. Each of the gas supply mechanisms 24A to 24E includes a valve and a mass flow controller configured to control the flow rate of the process gas supplied from each of the gas supply sources 23A to 23E to the process gas inlet tube 21.

DIPAS gas is a gas for forming a seed layer to form a first seed layer on a surface of a silicon oxide film formed on the surface of the wafer W, and the gas supply source 23A and the gas supply mechanism 24A constitute a DIPAS gas supply unit.

$Si_2H_6$ gas is a gas for forming a seed layer to form a second seed layer on the surface of the first seed layer, and the gas supply source 23B and the gas supply mechanism 24B constitute a $Si_2H_6$ (disilane) gas supply unit.

The DIPAS gas supply unit and the disilane gas supply unit are gas supply units for forming the seed layer and may be referred to as a seed layer forming gas supply unit.

In the present embodiment, two types of seed layer forming gases are described, but any one type of seed layer forming gas may be used. In addition, when a film is formed on the wafer W on which the seed layer is already formed, the seed layer forming gas supply unit need not be disposed. In addition, gases other than DIPAS gas and $Si_2H_6$ gas may be used, even if a seed layer forming gas supply unit is used. Thus, the DIPAS gas supply unit, the disilane gas supply unit, and the seed layer forming gas supply unit may be disposed as necessary.

$SiH_4$ gas is a film deposition gas for depositing a silicon (Si) film on the wafer W, and the gas supply source 23C and the gas supply mechanism 24C constitute a silicon-containing gas supply unit. Because the silicon-containing gas is a gas used for depositing a film, the silicon-containing gas supply unit may be referred to as a film deposition gas supply unit.

$Cl_2$ gas is an etching gas for etching the Si film, with the gas supply source 23D and the gas supply 24D constituting the chlorine gas supply unit. $H_2$ gas is an additive gas to reduce etching power of the etching gas, and the gas supply source 23E and the gas supply mechanism 24E constitute a hydrogen gas supply unit. Because chlorine gas and hydrogen gas are supplied simultaneously as an etching gas, the chlorine gas supply unit and the hydrogen gas supply unit may be integrally referred to as an etching gas supply unit.

The upstream side of the purge gas inlet tube 31 is connected to a supply source 32 of nitrogen ($N_2$) gas, which is a purge gas. A gas supply mechanism 33 is disposed in the purge gas inlet tube 31. The gas supply mechanism 33 is configured in substantially the same manner as the gas supply mechanisms 24A to 24E to control a flow rate of the purge gas downstream the inlet tube 31.

An exhaust port 25 opens to the side surface of the support ring 15 on the manifold 14. An exhaust gas generated by the inner tube 12 passes through a space formed between the inner tube 12 and the outer tube 13 and is evacuated to the exhaust port 25. An exhaust pipe 26 is hermetically connected to the exhaust port 25. A valve 27 and a vacuum pump 28 are disposed in this order from the upstream side of the exhaust pipe 26. By adjusting the opening degree of the valve 27, the pressure in the reactor tube 11 is controlled to the desired pressure.

The vertical heat processing apparatus includes a controller 30 that is constituted of a computer, and the controller 30 includes a program. In this program, a group of steps is configured so that a control signal can be output to each section of the vertical heat processing apparatus 1 to control the operation of each section so that a series of processing operations described below can be performed on the wafer W. Specifically, a control signal is output to control the elevation of the lid 16 by the boat elevator 10, the output of the heater 19 (that is, the temperature of the wafer W), the opening degree of the valve 27, and the flow rates of respective gases into the reactor tube 11 by the gas supply mechanisms 24A to 24C, 33. The program is stored in a storage medium such as a hard disk, a flexible disk, a compact disk, a magneto optical disk (MO), a memory card, or the like in the controller 30.

Figure 2:
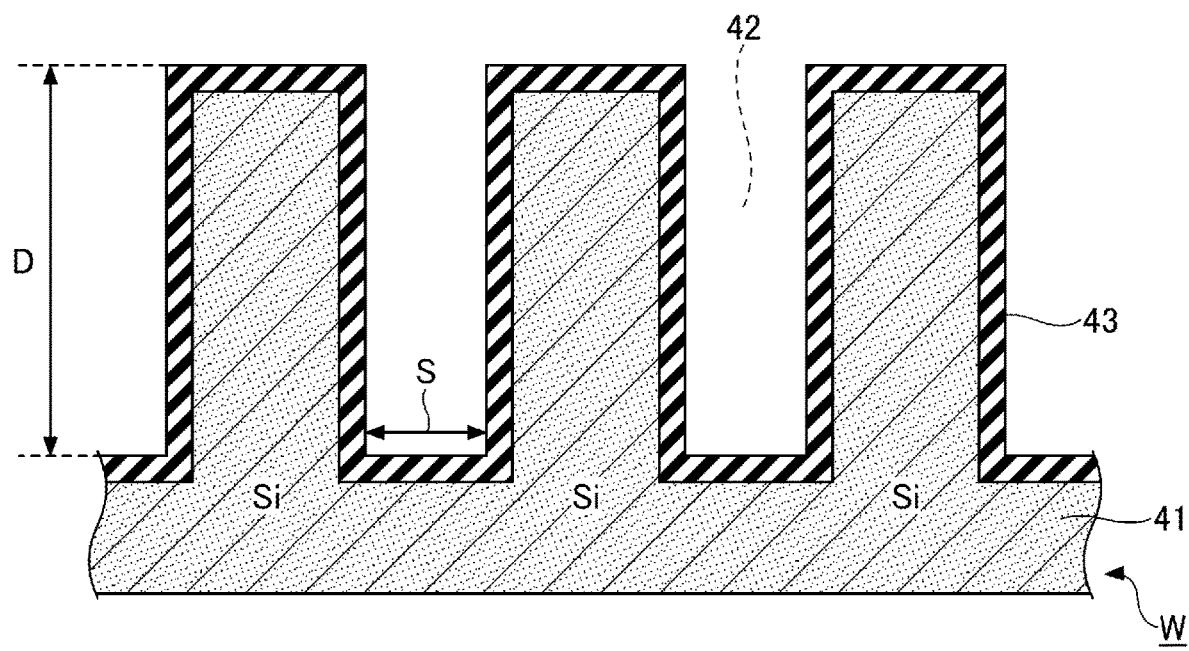
FIG. 2 is a diagram illustrating an example of a shape of recesses formed in a surface of a wafer W.

FIG. 2 is a diagram illustrating an example of a shape of recesses formed in a surface of a wafer W. As illustrated in FIG. 2, a silicon (Si) layer 41 is provided on the surface of the wafer W. The surface layer of the Si layer 41 is oxidized and a silicon oxide film 43 is formed. Recesses 42 having a depth D and an opening width S are formed. The recesses 42 are formed, for example, as trenches or through holes, but may be formed into any particular shapes if the recesses 42 have depressed shapes.

In FIG. 2, the aspect ratio of the recesses 42 is D/S. The aspect ratio of the recesses is, for example, two or more.

First, a typical method for filling a recess 42 with a silicon film by applying a DED process to the recess 42 as illustrated in FIG. 2 will be described.

FIGS. 3A to 3D are diagrams illustrating an example of a typical conventional DED process.

Figure 3A:
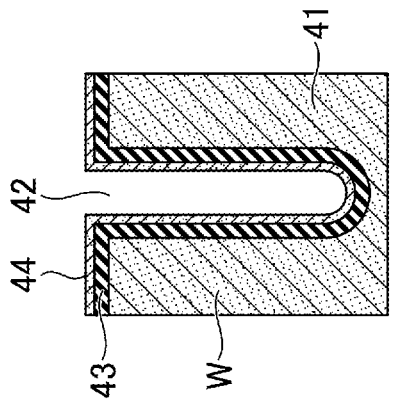
FIGS. 3A to 3D are diagrams illustrating an example of a typical conventional DED process.

FIG. 3A illustrates a seed layer forming step of forming a seed layer 44 on a surface of a wafer W having a recess 42 on the surface. In the seed layer forming step, a thin silicon film is formed as the seed layer 44 on a surface of a silicon oxide film 43. For forming the seed layer 44, for example, Si$_2$H$_6$ is used as a film deposition gas.

Figure 3B:
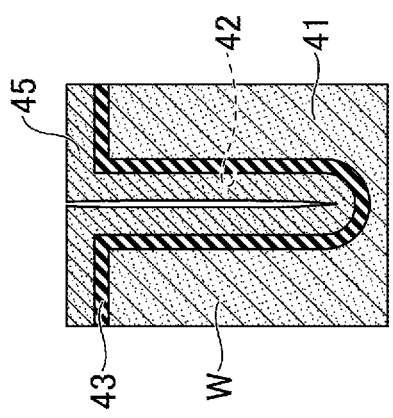

FIG. 3B illustrates a first film deposition process. In the first film deposition step, for example, SiH$_4$ gas is used as a film deposition gas and is deposited on the surface of the wafer W, and a silicon film 45 is deposited in the recess 42.

Figure 3C:
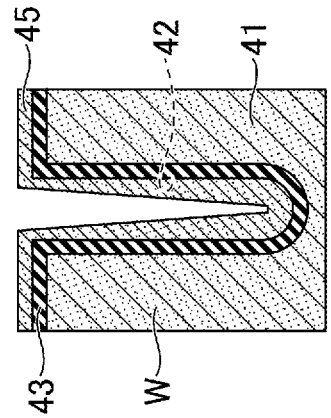

FIG. 3C illustrates an example of an etching process. In the etching process, the deposited silicon film 45 is etched to widen the opening width so that the top end is not blocked. Then, a cross-section of a V-shape is formed in the silicon film 45.

Figure 3D:
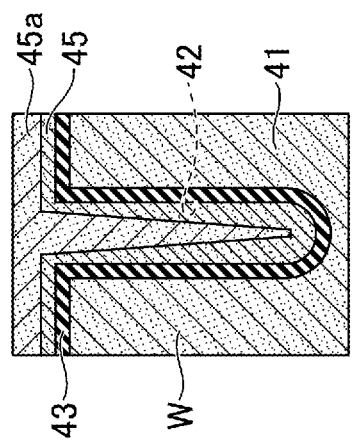

FIG. 3D illustrates a second film deposition process. In the second film deposition process, a new silicon film 45$a$ is deposited on the V-shaped silicon film 45, and the entire recess 42 is filled with the silicon films 45, 45$a$.

Such a filling method is a DED process, and a recess 42 having a high aspect ratio can be filled with the silicon films 45, 45$a$ without a void.

However, when recesses 42 with different aspect ratios are formed in the surface of the wafer W, the DED process takes a long time because the DED process requires more repetition times.

FIGS. 4A to 4D are diagrams for explaining a problem with filling a pattern of recesses 42 having multiple aspect ratios by a typical DED process. In FIGS. 4A to 4D, the silicon oxide film 43 is omitted.

FIG. 4A illustrates a state of a seed layer 44 formed on a surface of a wafer W including recesses 42 having a plurality of aspect ratios.

FIG. 4B illustrates a state of filling a recess 42 having the highest aspect ratio by a DED process. As illustrated in FIG. 4B, the recess 42 having the highest aspect ratio is first filled with a silicon film 45. This is because etching predominates in a recess 42 having a low aspect ratio, and because filling the recess 42 having the low aspect ratio by just repeating the DED process is simply difficult. That is, the etching rate and deposition conditions must be adjusted and the procedure of sequentially filling the recesses 42 in descending order according to aspect ratio, is required.

FIG. 4C illustrates a state of filling a recess 42 having the second highest aspect ratio. After filling the recess having the highest aspect ratio, the recess 42 having the second highest aspect ratio is filled with a silicon film 45. That is, as illustrated in FIGS. 4B and 4C, the presence of recesses 42 having different aspect ratios necessitates sequential filling from recesses 42 having higher aspect ratios.

FIG. 4D is a diagram illustrating a state in which filling is completed. Thus, although all recesses 42 having different aspect ratios can be ultimately filled with the silicon film 45, the process requires repetition of DED processes a very high number of times.

Figure 5:
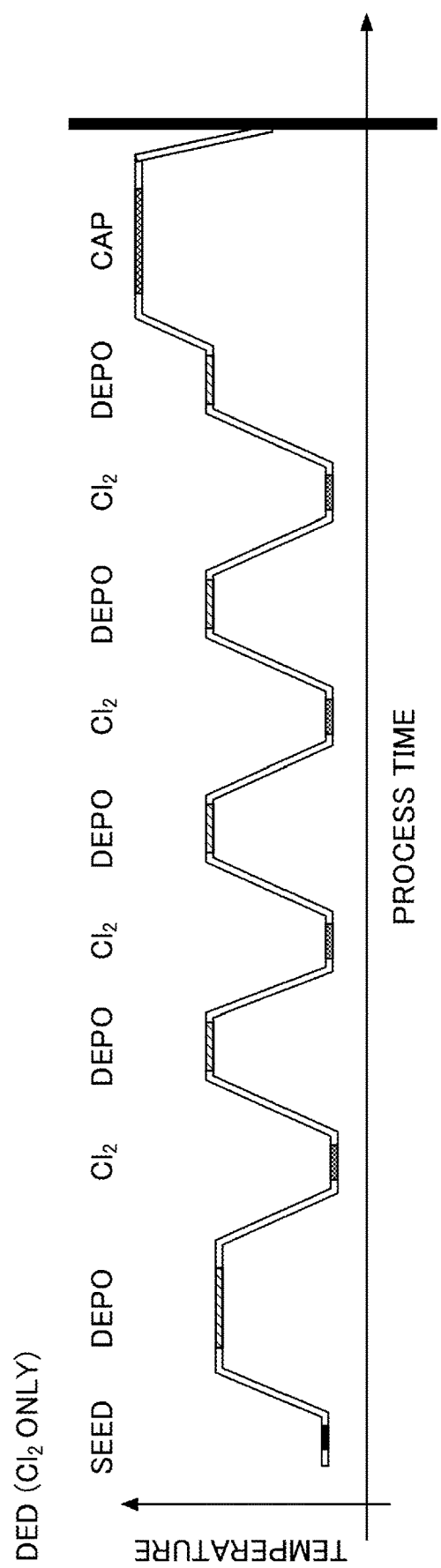
FIG. 5 is a diagram showing temperature changes in a process chamber when performing a DED process.

FIG. 5 is a diagram illustrating the temperature change in the process chamber during the execution of the DED process illustrated in FIG. 4. As illustrated in FIG. 5, in the film deposition step and the etching step, the process temperature is different and the film deposition temperature is higher than the etching temperature. To deposit the high-quality silicon film 45, the temperature at the film deposition process is set at a temperature for achieving the optimum deposition condition.

On the other hand, when etching is performed at the same temperature as in the film deposition process, the etching capability is too strong to control the amount of etching. Accordingly, during etching, it is necessary to control the amount of etching by decreasing the temperature in the process chamber.

As a result, up-and-down changes in the temperature setting occur between the etching process and the film deposition process, and a long waste time is generated to stabilize the temperature in the process chamber.

In FIG. 5, five film deposition processes and four etching processes are illustrated. This results in eight up-and-down changes in temperature.

Figure 6:
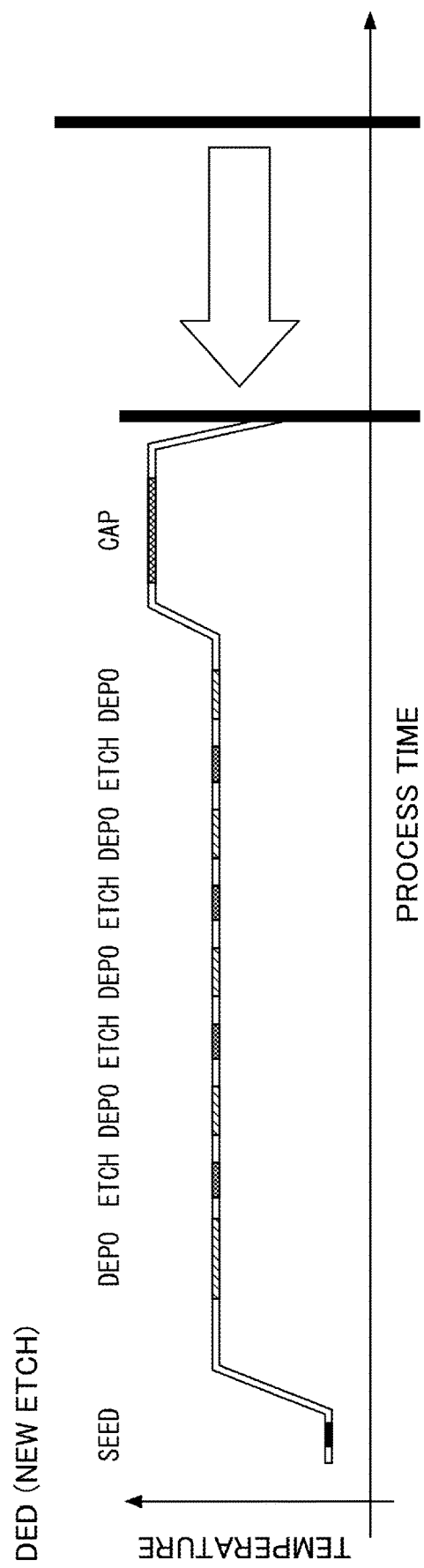
FIG. 6 is a diagram illustrating an example of a DED process by a method for manufacturing a semiconductor device according to an embodiment of the present disclosure.

FIG. 6 is a diagram illustrating an example of a DED process according to a method for manufacturing a semiconductor device according to an embodiment of the disclosure. In the method for manufacturing a semiconductor device according to the present embodiment, the DED process is performed at a constant temperature, that is, etching is performed at a film deposition temperature. This eliminates the need to move the temperature up and down eight times as illustrated in FIG. 5, thereby eliminating the time required to move the temperature up and down. This eliminates the need for time to increase and decrease the temperature in the process chamber and time to stabilize the temperature, even if the same DED repetition time is required, thereby greatly decreasing the process time and improving productivity.

FIG. 6 illustrates that the temperature up-and down time is eliminated and the process time is greatly reduced compared to FIG. 5. Thus, in the method for manufacturing the semiconductor device according to the present disclosure, the DED process is performed at the same temperature, that is, the deposition temperature, and the productivity is improved by greatly shortening the process time while maintaining the high-quality deposition.

FIG. 7 is a diagram for explaining how to perform a method for manufacturing a semiconductor device according to the present embodiment. In the method for manufacturing the semiconductor device according to the present embodiment, hydrogen is added to chlorine during the etching process. This allows the etching capability to be reduced and the etching to be performed at the same temperature as the deposition temperature. That is, the controllability of the etching at high temperatures can be significantly improved.

Because the film deposition temperature of typical SiH$_4$ gas is 440 degrees C. to 530 degrees C. inclusive and the chlorine etching temperature is 300 degrees C. to 400 degrees C. inclusive, there is no overlap between the both temperatures. In other words, etching at the film deposition temperature causes the etching rate to be too high and the etching cannot be controlled.

In FIG. 7, the horizontal axis shows the etching temperature of chlorine (degrees C.), and the vertical axis shows the etching rate (nm/min).

In FIG. 7, a point A shows an etching state of only chlorine. In this case, an etching rate is about 1.7 (nm/min) at 400 degrees C., but adding 500 sccm of hydrogen decreases the etching rate to about 0.7 (nm/min), and decreases the etching rate by 44%, as indicated by a point B.

As the temperature is increased to 420 degrees C., 440 degrees C., and 460 degrees C., the etching rate increases, but is lower than 1.6 (nm/min) even at 460 degrees C. The etching rate decreases to 1.4 (nm/min) by changing the single-wafer type film deposition apparatus to a vertical film deposition apparatus. When the amount of added hydrogen is twice as much as 1000 sccm, the etching rate decreases to about 1.2.

The etching rate that is lower than 1.6 (nm/min) is a controllable etching rate, and is in a range capable of controlling the etching by adjusting time and the like.

Therefore, by performing etching by adding hydrogen to chlorine, the etching rate is decreased and the etching can be performed at the same temperature as that of the film deposition.

FIGS. 8A and 8B are diagrams for explaining a reason why an etching rate is decreased by adding hydrogen to chlorine. FIG. 8A illustrates a state of etching carried out only with chlorine, and FIG. 8B illustrates a state of etching carried out by adding hydrogen to chlorine.

As illustrated in FIG. 8A, for chlorine only, all chlorine functions as an etching gas.

On the other hand, FIG. 8B illustrates a state in which some chlorine is converted to HCl by the addition of hydrogen and the number of chlorine molecules is decreased.

Specifically, by adding hydrogen to chlorine, the following reaction of Formula (2) can take place.

$$H_2 + Cl_2 \rightarrow 2HCl \quad (2)$$

Here, HCl (hydrochloric acid, hydrogen chloride) cannot etch a silicon film at 400 degrees C. Thus, chlorine etches the silicon film at temperatures ranging from 300 degrees C. to 400 degrees C. while hydrogen chloride does not etch the silicon film at 400 degrees C. Therefore, adding hydrogen to chlorine is considered to cause part of the chlorine to be converted to hydrogen chloride, while decreasing the amount of chlorine and decreasing the etching capability. In addition, because the amount of chlorine is decreased, the partial pressure of chlorine is also decreased, and the etching power of chlorine is considered to be relatively decreased.

Thus, by adding hydrogen to chlorine, a part of chlorine is converted to hydrogen chloride with no etching capability, and the overall etching capability is considered to be decreased.

Figure 9B:
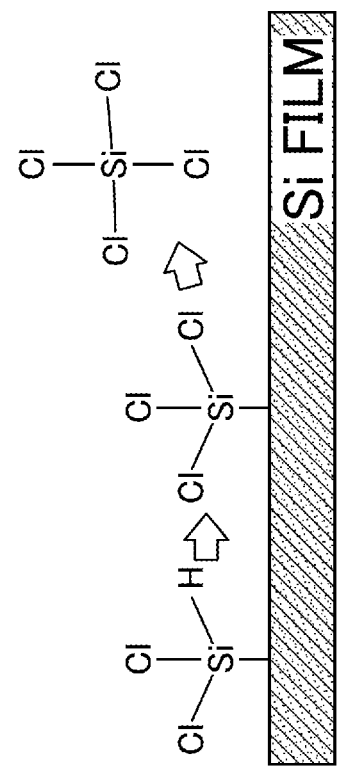
FIGS. 9A and 9B are diagrams for explaining a second reason why an etching rate is decreased by adding hydrogen to chlorine.
Figure 9A:
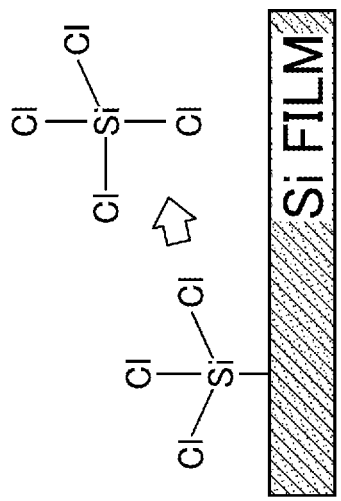

FIGS. 9A and 9B are diagrams for explaining a second reason why an etching rate is decreased by adding hydrogen to chlorine. FIG. 9A illustrates a state of etching carried out only with chlorine, and FIG. 9B illustrates a state of etching carried out by adding hydrogen to chlorine.

As illustrated in FIG. 9A, when chlorine is supplied as an etching gas, an Si—Cl bond occurs and etching advances.

Adding hydrogen to chlorine causes a Si—H bond, as illustrated in FIG. 9B. Then the reaction of Formula (3) would occur after the Si—H bond occurs.

$$Si-H + Cl_2 \rightarrow Si-Cl + HCl \quad (3)$$

In other words, the Si—Cl bond, which is the goal of etching, does not occur immediately, and once Si—H bond is formed, it may take longer to generate $SiCl_4$ and to decrease the etching reaction. In addition, when Si—Cl bonds are formed, HCl is considered to be generated and $Cl_2$ is considered to be consumed.

The reaction models of FIGS. 8A and 8B and 9A and 9B are inferences and are not accurately confirmed, but when compared to the results of FIG. 7, one or both of FIGS. 8A and 8B and 9A and 9B are more likely to occur.

Next, an embodiment of a method for manufacturing a semiconductor device according to the present embodiment will be described using the substrate processing apparatus illustrated in FIG. 1.

FIGS. 10A to 10D are diagrams illustrating a series of processes of a method for manufacturing a semiconductor device according to the present embodiment. Referring to FIGS. 1 and 10A to 10D, the method for manufacturing the semiconductor device according to the present embodiment will be described.

First, a wafer W described in FIG. 2 is transferred and held in the wafer boat 3 by a transfer mechanism (not illustrated). Thereafter, the wafer boat 3 is placed on the lid 16 that is in the lowered position. The lid 16 is then raised to the elevated position; the wafer boat 3 is introduced into the reactor tube 11; and the lid 16 closes the opening 17 of the reactor tube 11, so that the inside of the reactor tube 11 is airtight. Subsequently, a purge gas is supplied into the reactor tube 11; the inside of the reactor tube 11 is evacuated to a vacuum atmosphere of a predetermined pressure; and the wafer W is heated by the heater 19 to a predetermined temperature. The temperature is set to a predetermined deposition temperature suitable for depositing a silicon film on the wafer W. The temperature control of the heater 19 may be performed by the controller 30.

For example, when $SiH_4$ gas is used as a deposition gas, the temperature is set in the range of 440 degrees C. to 530 degrees C., and is set to a predetermined temperature controllable by an etching gas of chlorine to which hydrogen is added.

Figure 10A:
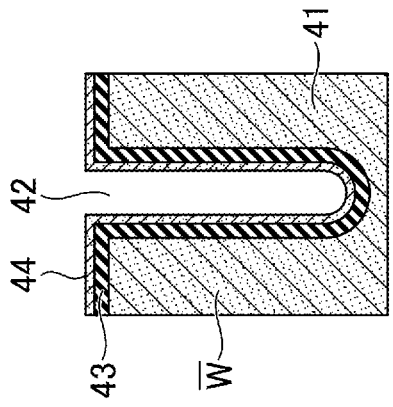
FIGS. 10A to 10D are diagrams illustrating a series of processes of a method for manufacturing a semiconductor device according to the present embodiment.

FIG. 10A is a diagram illustrating an example of a seed layer forming process.

After the wafer W is heated, a purge gas supply is stopped and DIPAS gas is supplied into the reactor tube 11. DIPAS gas is deposited on a surface of a silicon oxide film 43 on a wafer W, and a seed layer 44 is formed to coat the silicon oxide film 43 (see FIG. 10A).

Figure 10B:
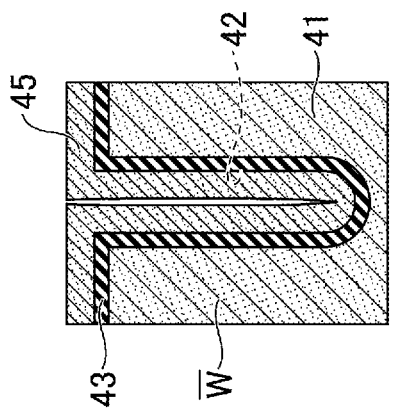

FIG. 10B is a diagram illustrating an example of a first film deposition process.

Thereafter, DIPAS gas supply is stopped, the purge gas is supplied to the reactor tube 11, DIPAS gas is purged from the reactor tube 11, and $Si_2H_6$ gas is supplied to the reactor tube 11. $Si_2H_6$ gas is deposited on a first seed layer, and a second seed layer is formed to coat the first seed layer. Thereafter, $Si_2H_6$ gas supply is stopped and the purge gas is supplied to the reactor tube 11 to purge $Si_2H_6$ gas from the reactor tube 11.

The supply of the purge gas is then stopped and $SiH_4$ gas is supplied into the reactor tube 11. As illustrated in FIG. 10B, $SiH_4$ gas is deposited on the second seed layer and formed over the surface of the wafer W such that a Si film 44 covers the second seed layer. Then, $SiH_4$ gas continues to be deposited and a Si film 45 grows in size. That is, the thickness of the Si film 45 is increased. Then, for example, as illustrated in FIG. 10B, the $SiH_4$ gas supply stops before the upper side of the recess 42 is blocked by the Si film 45. Because the thickness of the seed layer 44 is small, a representation thereof including FIG. 10B is omitted.

After the $SiH_4$ gas supply is stopped, a purge gas is supplied into the reactor tube 11 and $SiH_4$ gas is purged from the reactor tube 11.

Figure 10C:
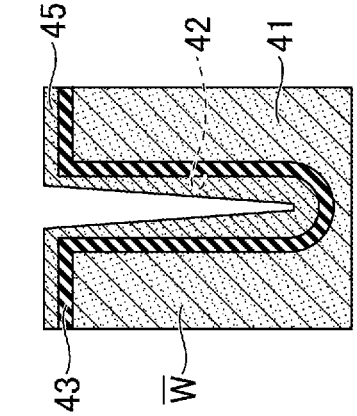

FIG. 10C is a diagram illustrating an example of an etching process. In the etching process, the process gas inlet tube 21 supplies $Cl_2$ gas from the gas supply source 23D and $H_2$ gas from the gas supply source 23E, which are mixed in the process gas inlet tube 21, and are supplied to the wafer W in the reactor tube 11 (FIG. 10C). In order to ensure that both the etching effect of $Cl_2$ gas and the etching capability inhibition effect of $H_2$ gas described below are achieved, for example, $Cl_2$ gas and $H_2$ gas are supplied such that the flow rate of $H_2$ gas/flow rate of $Cl_2$ gas becomes 1/10 or more. More specifically, for example, $Cl_2$ gas is supplied at 300 sccm and $H_2$ gas is supplied in the range of 30 sccm to 1000 sccm in the reactor tube 11 (FIGS. 4A to 4D).

During etching, the set temperature of the heater 19 is not changed, and the film deposition temperature set in the first film deposition process is maintained. For example, when the temperature in the reactor tube 11 is set to a predetermined temperature in the range of 440 degrees C. to 530 degrees C., the etching process is performed at the set film deposition temperature. This eliminates the need to provide a temperature up-and-down time and greatly improves productivity.

In the case of a substrate processing apparatus in which a heater 19 is disposed below a substrate, for example, under a susceptor of a single-wafer type or a semi-batch type substrate processing apparatus, the heater temperature is set as a substrate temperature rather than the temperature in the process chamber. In any case, etching is performed at the set temperature of the heater 19 to heat the process chamber or the substrate without changing from the film deposition temperature.

$Cl_2$ gas is an etching gas for the Si film 45 and is heated in the reactor tube 11 to provide thermal energy to produce an active species, such as Cl radicals. Because the active species are relatively reactive to Si, the active species react with Si outside the recess 42 of the wafer W and Si on the upper side of the recess 42 until reaching the lower side in the recess 42 of the wafer W, and produce $SiCl_4$ (silicon tetrachloride) while etching the Si film 45. Accordingly, etching is performed so that the decrease in thickness of the upper Si film 45 in the recess 42 is greater than the decrease in thickness of the lower Si film 45 in the recess 42, thereby increasing the opening width on the upper side in the recess 42. One mole of $Cl_2$ gives two moles of Cl radicals. In other words, because a relatively large number of active species are formed, widening the opening can advance at a relatively high speed.

However, when etching is performed at the film deposition temperature using $Cl_2$ gas, the etching becomes uncontrollable. Hence, by adding $H_2$ gas to $Cl_2$ gas, the etching capability is decreased, and the etching is performed to the controllable extent.

$H_2$ gas is a process gas to decrease the etching capability of $Cl_2$ gas and to improve etching controllability at high temperatures. As illustrated in FIGS. 8A and 8B and 9A and 9B, the formation of HCl or Si—H bonds decreases the etching capability of $Cl_2$ and improves etching controllability.

Thereafter, the supply of $Cl_2$ and $H_2$ gas into the reactor tube 11 is stopped, and the etching process is terminated (FIG. 10C). Because the etching of the Si film 45 is inhibited at the lower side in the recess 42 during the etching process as described above, the Si film 45 remains in the recess 42 at the end of the etching process as illustrated in FIG. 10C.

A purge gas is supplied and the gas mixture is removed from the reactor tube 11. After a predetermined period of time, the purge gas supply is stopped.

Figure 10D:
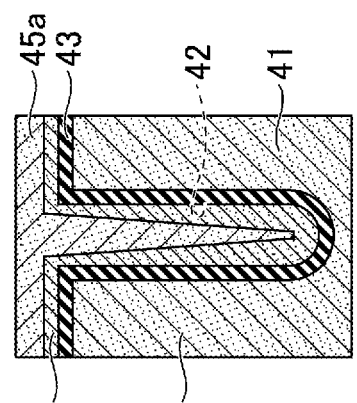

FIG. 10D is a diagram illustrating an example of a second film deposition process. In the second film deposition process, $SiH_4$ gas is supplied to the reactor tube 11, and $SiH_4$ gas is deposited on the Si film 45 to grow the Si film 45.

Thereafter, the $SiH_4$ gas supply to the reactor tube 11 is stopped, and the film deposition process is completed. The purge gas is then supplied to remove $SiH_4$ gas from the reactor tube 11.

In FIGS. 10A to 10D, for convenience, the recess 42 is filled with the silicon film 45 in a single DED process. However, when the inside of the recess 42 is not filled in a single DED process, the etching process illustrated in FIG. 10C and the film deposition process illustrated in FIG. 10D are repeated alternately. Then, the recess 42 is filled with the silicon film 45.

As illustrated in FIGS. 4A to 4D, when there is a plurality of recesses 42 having different aspect ratios, the recesses 42 are sequentially filled with the silicon film 45 in descending order of aspect ratio. Thus, the DED process illustrated in FIGS. 10A to 10D is repeated until all of the recesses 42 having various aspect ratios formed in the surface of the wafer W are filled with the silicon film 45. Filling one recess 42 includes repeating the etching process of FIG. 10C and the film deposition process of FIG. 10D, and the number of repetitions varies according to the aspect ratio.

Once all recesses 42 have been filled, the temperature in the reactor tube 11 is decreased. During the process, the temperature was maintained at a constant film deposition temperature, but when the process is completed, the temperature in the reactor tube 11 is decreased to take out the wafer W. Thus, the temperature of the wafer W is decreased.

Subsequently, after the lid 16 is lowered and the wafer boat 3 is unloaded from the reactor tube 11, the wafer W is removed from the wafer boat 3 by a transfer mechanism (not illustrated) and one batch of wafer W process is completed. Because the processing temperature can be kept constant during the process, the filling process can be performed in a short time.

In the present embodiment, an example in which a vertical heat processing apparatus is used as a substrate processing apparatus has been described. However, a substrate processing apparatus can be formed as a single-wafer type film deposition apparatus or a semi-batch type film deposition apparatus in which an ALD (Atomic Layer Deposition) is performed on five or six wafers W using a turntable.

The same principle can be also applied to a substrate processing apparatus using plasma. That is, a method for manufacturing a semiconductor device and a substrate processing apparatus according to the present embodiment can be broadly applied to a process and a substrate processing apparatus for filling a recess with a silicon film using a DED process.

According to the present disclosure, etching can be performed in a DED process without decreasing a film deposition temperature.

All examples recited herein are intended for pedagogical purposes to aid the reader in understanding the disclosure and the concepts contributed by the inventor to furthering the art, and are to be construed as being without limitation to such specifically recited examples and conditions, nor does the organization of such examples in the specification relate to a showing of the superiority or inferiority of the disclosure. Although the embodiments of the present disclosure have been described in detail, it should be understood that various changes, substitutions, and alterations could be made hereto without departing from the spirit and scope of the disclosure.

What is claimed is:

1. A method for manufacturing a semiconductor device, the method comprising:
supplying a silicon-containing gas to a substrate having a recess in a surface thereof at a predetermined film deposition temperature, thereby depositing a first silicon film in the recess;
simultaneously supplying only both $Cl_2$ gas and $H_2$ gas to the substrate while maintaining the predetermined film deposition temperature, thereby etching the first silicon film deposited in the recess to expand an opening width of the first silicon film, a ratio of a flow rate of the $H_2$ gas to a flow rate of the $Cl_2$ gas being 1/10 or above; and
supplying the silicon-containing gas to the substrate while maintaining the predetermined film deposition temperature, thereby further depositing a second silicon film on the first silicon film in the recess.

2. The method as claimed in claim 1, wherein the simultaneously supplying only both $Cl_2$ gas and $H_2$ gas to the substrate and the supplying the silicon-containing gas to the substrate while maintaining the predetermined film deposition temperature are alternately repeated.

3. The method as claimed in claim 2, wherein the simultaneously supplying only both $Cl_2$ gas and $H_2$ gas to the substrate and the supplying the silicon-containing gas to the substrate while maintaining the predetermined film deposition temperature are repeated until the recess is filled with the first and second silicon films.

4. The method as claimed in claim 3, wherein the substrate has a plurality of recesses having different aspect ratios in the surface, and
wherein the plurality of recesses is sequentially filled with the first and second silicon films in descending order of aspect ratio.

5. The method as claimed in claim 1, wherein the predetermined film deposition temperature is in a range of 440 degrees C. to 530 degrees C. inclusive.

6. The method as claimed in claim 1, wherein the silicon-containing gas is $SiH_4$ gas.

7. The method as claimed in claim 1, wherein the simultaneously supplying only both $Cl_2$ gas and $H_2$ gas to the substrate comprises supplying $Cl_2$ gas while adding $H_2$ gas to the $Cl_2$ gas.

8. The method as claimed in claim 1, wherein the flow rate of the $Cl_2$ gas being 300 sccm, and the flow rate of the $H_2$ gas being in a range of 30 sccm to 1000 sccm.

* * * * *